United States Patent [19]

Sun

[11] Patent Number: 5,473,624
[45] Date of Patent: * Dec. 5, 1995

[54] LASER SYSTEM AND METHOD FOR SELECTIVELY SEVERING LINKS

[75] Inventor: Yunlong Sun, Portland, Oreg.

[73] Assignee: Electro Scientific Industries, Inc., Portland, Oreg.

[ * ] Notice: The portion of the term of this patent subsequent to Nov. 23, 2010, has been disclaimed.

[21] Appl. No.: 343,778

[22] Filed: Nov. 22, 1994

Related U.S. Application Data

[63] Continuation-in-part of PCT/US93/08484, Sep. 10, 1993, which is a continuation-in-part of Ser. No. 943,875, Sep. 10, 1992, Pat. No. 5,265,114.

[51] Int. Cl.⁶ ........................................... H01S 3/09
[52] U.S. Cl. .................. 372/69; 372/25; 372/11
[58] Field of Search .................. 378/69, 70, 71, 378/9, 10, 25, 26, 11

[56] References Cited

U.S. PATENT DOCUMENTS

| | | |
|---|---|---|
| 4,656,635 | 4/1987 | Baer et al. ................... 372/9 |
| 4,731,795 | 3/1988 | Clark et al. ................... 372/71 |
| 4,930,901 | 6/1990 | Johnson et al. ................ 372/69 |
| 4,965,803 | 10/1990 | Esterowitz et al. .............. 372/69 |
| 5,091,991 | 2/1992 | Tulip ........................... 372/4 |
| 5,265,114 | 11/1993 | Sun et al. ..................... 372/69 |

*Primary Examiner*—Leon Scott, Jr.
*Attorney, Agent, or Firm*—Stoel Rives Boley Jones & Grey

[57] ABSTRACT

A laser system and processing method exploits the absorption contrast between the materials from which a link (12) and an underlying substrate (22) are made to effectively remove the link from the substrate. Laser output in a wavelength range of 1.2 to 3 μm (30) optimizes the absorption contrast between many materials (e.g., metals, polysilicon, polycides, or disilicides) and integrated circuit substrates (e.g., silicon, gallium arsenide, or other semiconductors) and permits the use of laser output in a wider range of energy or power levels, pulse widths, and spot sizes without risking damage to the substrates or adjacent circuit structures. Existing link processing laser systems can be readily modified to operate in the 1.2 to 3 μm range.

21 Claims, 5 Drawing Sheets

LASER SYSTEM AND METHOD FOR SELECTIVELY SEVERING LINKS

This is a continuation-in-part of International Patent Application No. PCT/US93/08484, filed Sep. 10, 1993, which is a continuation-in-part of U.S. patent application No. 07/943,875, filed Sep. 10, 1992, now U.S. Pat. No. 5,265,114, issued Nov. 23, 1993.

TECHNICAL FIELD

The present invention relates to laser systems and methods for selectively processing a material of a single or multiple layer structure of a multimaterial, multilayer device and, in particular, to laser systems and processing methods that employ an output within a wavelength range that facilitates selective removal of an electrically conductive link structure on an integrated circuit substrate, such as silicon, gallium arsenide, or other semiconductor materials.

BACKGROUND OF THE INVENTION

Conventional laser systems are typically employed for processing target structures such as electrically conductive links in integrated circuits or memory devices such as EPROMs, DRAMs, and SRAMs. Link processing, which is presented herein only by way of example of selective material processing, may include total or partial removal, cutting, or vaporization of the link material. Examples of link processing laser systems include models in the 8000 and 9000 series manufactured by Electro Scientific Industries, Inc., which is the assignee of the present application. These systems typically utilize laser output wavelengths of 1.064 µm, 1.047 µm, and 0.532 µm.

The physics and computer modeling for laser-based link processing are described by L. M. Scarfone and J. D. Chlipala, "Computer Simulation of Target Link Explosion in Programmable Redundancy for Silicon Memory," *Journal of Materials Research*, vol. 1, No. 2, Mar.–Apr. 1986, at 368–81, and J. D. Chlipala, L. M. Scarfone, and Chih-Yuan Lu, "Computer-Simulated Explosion of Poly-Silicide Links in Laser-Programmable Redundancy for VLSI Memory Repair," *IEEE Transactions on Electron Devices*, Vol. 36, No. 6, June 1989, at 1056–61.

FIGS. 1A and 1B are respective cross-sectional side elevation and top views depicting a conventional output energy distribution of a laser output or pulse 10 directed at an integrated circuit or memory link structure 12 positioned between link terminators 14 and covered by a protective layer 16 that is often the result of oxide passivation. Link structure 12 may be composed of one or more layers of a single material or a composite "sandwich" of several materials including those required for anti-reflective coating, binding, or other manufacturing purposes. For example, link structure 12 may include sublayers of titanium and tungsten to enhance adhesion between an aluminum base link material and a substrate 22, such as silicon, gallium arsenide, or other semiconductor materials. Substrate 22 may also include oxide layers.

With reference to FIGS. 1A and 1B, Chlipala et al. suggest that a laser pulse 10 focused to a spot 18 of radius R (which is, for example, about 2 µm) and applied across link structure 12 should have a suitable duration or pulse width and be of sufficient energy at a certain wavelength to cause a temperature distribution capable of cutting link structure 12. Because the spatial or critical dimensions of spot 18 are typically (but not always) larger than the width (which is, for example, about 1 µm) of link structure 12, a portion of laser pulse 10 impinges on substrate 22. Laser pulse 10 must, therefore, be tailored not to have energy sufficient to damage substrate 22 or adjacent circuit structures 20 either by direct laser energy absorption, by residual pulse energy coupled into substrate 22 below link structure 12 after it is vaporized, or by thermal conduction.

Yields of memory devices have been dramatically improved by employing 1.064 µm or 1.047 µm laser output to ablate polysilicon, polycide, disilicide, and other similar material link structures 12 to enable redundant memory cells. Even though it is a relatively poor electrical conductor, polysilicon-based material is well-characterized and is easily fabricated to form link structures 12 that can be processed by laser systems at energy levels that do not prohibitively damage substrate 22 when conventional laser wavelengths 1.047 µm or 1.064 µm are used. A laser output having well-controlled energy and power levels can generate a desired temperature distribution within a polysilicon link structure 12 that exceeds the melting temperature of polysilicon. Scarfone et al. attribute this advantage to the relatively large optical absorption depth of polysilicon at 1.064 µm in combination with other favorable parameters such as the mechanical strength, the thermal conductivity, and the melting and vaporization temperatures of polysilicon, protective layer 16, substrate 22, and other materials involved.

The technology trend is, however, toward developing more complex, higher density memories having more layers and smaller link structures 12 and memory cell dimensions. As the complexity and numbers of layers of memory devices have increased, the polysilicon-like links have typically become smaller and more deeply buried and thus more difficult to process at the conventional laser outputs of 1.047 µm or 1.064 µm. Accordingly, an expensive and time-consuming process is typically employed to delicately etch away surface layers to expose the polysilicon-like structures to be processed. Another disadvantage of polysilicon-like materials, including polycide and disilicide, is that their electrical resistance increases with smaller dimensions to values that will restrict the operating speed of the memory cells.

To address the higher electrical resistance and associated signal propagation delay contributed to polysilicon, memory manufacturers have developed and adopted multilayer and multimaterial constructions, including new link structure materials such as aluminum, titanium, nickel, copper, tungsten, platinum, gold, metal nitrides, or other electrically conductive metal-like materials. In general, these new types of link structures and materials are more difficult to process using a 1.047 µm or 1.064 µm wavelength laser because of factors such as higher or differing material melting points and/or differing thermal transition characteristics between different material layers of link structure 12.

These link structures 12 and new materials have a reduced laser power processing window because they generally require a higher power level to cleanly remove the link structure material. Thus, the lower power threshold for effective link processing is effectively raised while the upper power limit remains constant because the substrate damage threshold is unchanged.

Various types of spot-shaping (e.g., uniform, square, oval) were attempted to increase the coupling of energy into the link structure material while minimizing the energy coupled into substrate 22. These attempts achieved limited success and often caused more undesirable side effects.

Simply increasing the laser output power level has deleterious effects on silicon, gallium arsenide, and other semiconductor substrates 22 and adjacent circuit structures 20. On the other hand, increasing the laser output pulse width to provide more time for thermal conduction to redistribute the heat to the underlying volume of a high-conductivity link structure 12 increases the heat conducted into the substrate and the cumulative laser energy of the output pulse, thereby also increasing the risk of damage to substrate 22 and circuit structure 20. Thus, some practitioners have concluded that laser systems are no longer the proper tool for processing high-conductivity links and have discussed using ion beams instead as described by Jon Orloff, "Focused Ion Beams, *Scientific American,* October 1991, at. 96–101. However, ion beam technology is still largely experimental for such applications, is very expensive, is not an automated production process (i.e., it is very slow), and cannot easily be retrofitted into existing laser-based link cutting systems.

SUMMARY OF THE INVENTION

An object of the present invention is, therefore, to provide a laser system and method for cleanly processing link structures without damaging adjacent circuit structures or the underlying or surrounding substrate on which the structures are fabricated.

Another object of this invention is to provide such a system and method that employ selected laser output parameters to exploit the differential optical absorptance between substrates and structures of high-conductivity metal and metal-like materials or polysilicon-like materials (e.g., polycide, disilicide) in order to reduce or eliminate damage sustained by the substrate from residual laser output coupled into the substrate after the link structure has been vaporized.

A further object of this invention is to provide such a system and method that employ selected laser output parameters to exploit the differential optical absorptance between link materials and the substrate material in order to efficiently vaporize link structures without affecting the substrate or adjacent structures.

Yet another object of this invention is to provide such a system and method that enlarge the processing window, i.e., accept a greater variation in device construction, and/or allow a greater variation in laser output power and energy levels, pulse widths, and pulse repetition frequencies to accurately process link structures.

Still another object of this invention is to provide such a system and method that can be integrated into existing link processing laser systems.

The present invention exploits the differential absorption (also referred to as absorptance or absorption contrast) between link material and the underlying substrate. The system and method of the present invention provide a laser output beam in a nonconventional range of wavelengths for link processing. The output beam optimizes absorption contrast between, for example, silicon or gallium arsenide and high-conductivity materials including metals or semiconductors, and results in relatively efficient link processing (cutting or vaporizing) without risk of damage to the surrounding and underlying substrate material. In particular, silicon substrates are only slightly affected by laser output wavelengths in the 1.2 to 3.0 μm range (about 1 to 3 μm for gallium arsenide), while aluminum, nickel, tungsten, platinum, and gold, as well as other metals, metal alloys such as nickel chromide, metal nitrides (e.g., titanium or tantalum nitride), cesium silicide, and doped polysilicon-like materials absorb such laser output relatively well at these wavelengths.

Conventional laser systems and methods for processing link structures 12 have emphasized the laser power absorption and temperature distribution properties of link structure 12, whereas the present invention considers the optical transmission/absorption properties of substrate 22 as well. Conventional laser systems function primarily to control the temperature distribution within spot 18 by preferring 1.047 μm or 1.064 μm laser wavelengths over the 0.532 μm laser wavelength and manipulating the shape, including duration and power, of pulse 10 to avoid overheating substrate 22 while obtaining the highest possible uniform temperature distribution across link structure 12. Because the present invention exploits the differential absorption behavior of link materials and substrate 22, the attention to pulse shaping can be relaxed and a pulse 10 of greater energy can be used without risking damage to substrate 22.

Existing link processing laser systems can be modified to incorporate output in the 1.2 to 3.0 μm wavelength range. Existing laser devices that produce laser output within this wavelength range may also be adaptable for link processing, although they are conventionally employed in fiber optic communications, medical applications, military range finding, and atmospheric pollution monitoring. Such laser systems have not been used for general material processing because they are more complex and typically deliver laser output of significantly lower power or energy per pulse than, for example, a 1.064 μm Nd:YAG or a 10.6 μm $CO_2$ laser. The conventional wisdom in laser material processing of maximizing laser output average or peak power while maintaining beam quality reinforces the avoidance of using wavelengths that do not optimize output power. In contradistinction to the conventional wisdom, the present invention employs a laser output having a wavelength window that maximizes absorption contrast for selective material processing, even though the peak power of such laser output may be lower than that which is conventionally available for other wavelengths.

Additional objects and advantages of the invention will be apparent from the following detailed description of a preferred embodiment thereof, which proceeds with reference to the accompanying drawings.

DETAILED DESCRIPTION OF PREFERRED EMBODIMENTS

Figure 1A:
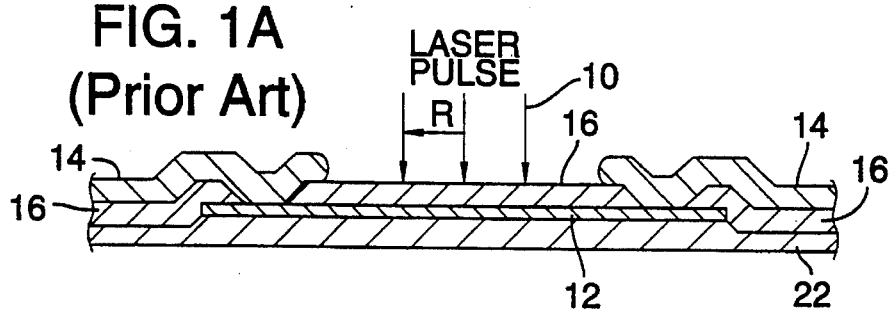
FIG. 1A is a fragmentary cross-sectional side view of a conventional semiconductor link structure receiving a laser pulse characterized by a particular energy distribution.
Figure 1B:
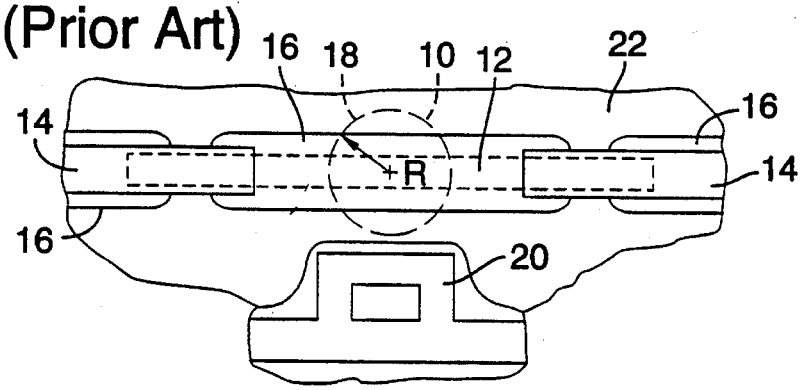
FIG. 1B is a fragmentary top view of the semiconductor link structure and the laser energy distribution of FIG. 1A, together with adjacent circuit structure.
Figure 2:
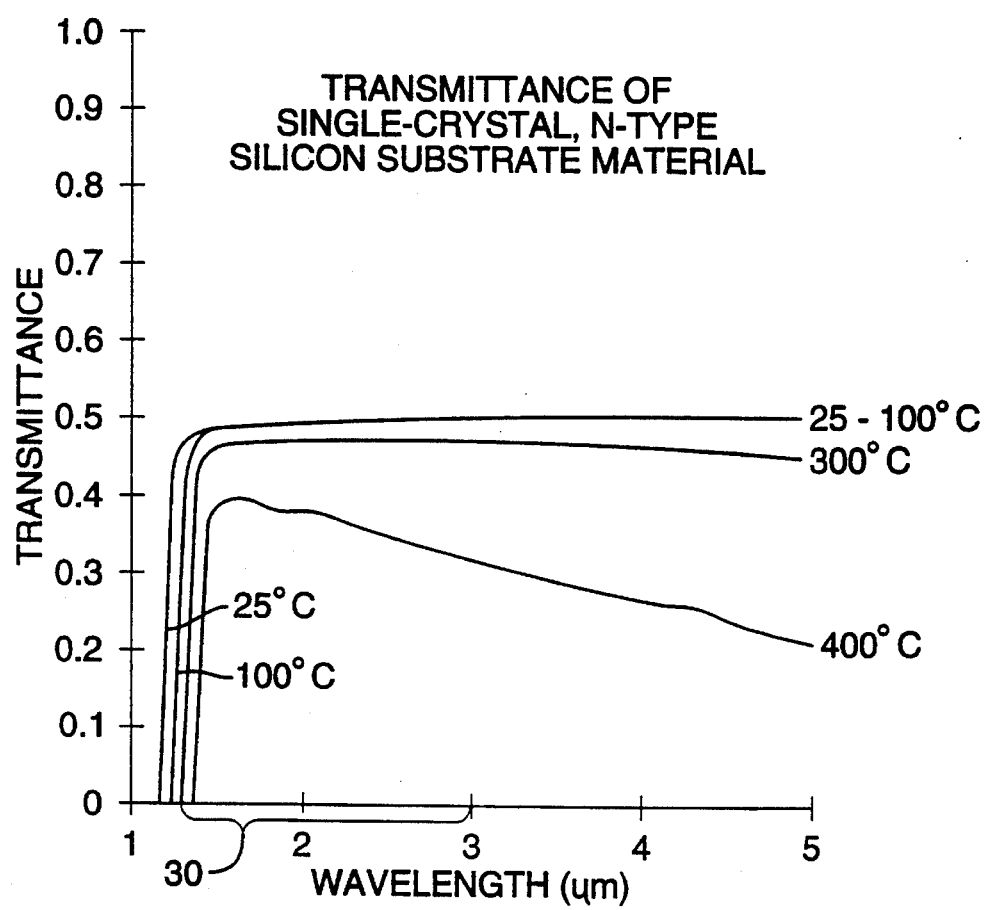
FIG. 2 shows graphical representations of optical transmission properties of silicon versus wavelength for various silicon temperatures.

FIG. 2 graphically shows the optical transmittance properties of silicon versus wavelength for various silicon temperatures. FIG. 2 is an enlarged replication of a portion of FIG. 6e-52 from D. T. Gillespie et al., *Appl. Opt., Vol.* 4, 1965, at 1488. FIG. 2 reveals that a 2.80 mm thick, single-crystal, N-type silicon will transmit nearly fifty percent of laser output directed at it in a wavelength range of about 1.12 to 4.5 μm when its temperature is between 25° C. and 300° C. The transmittance of this type of silicon sharply decreases as the wavelength output drops below 1.12 μm.

Figure 3:
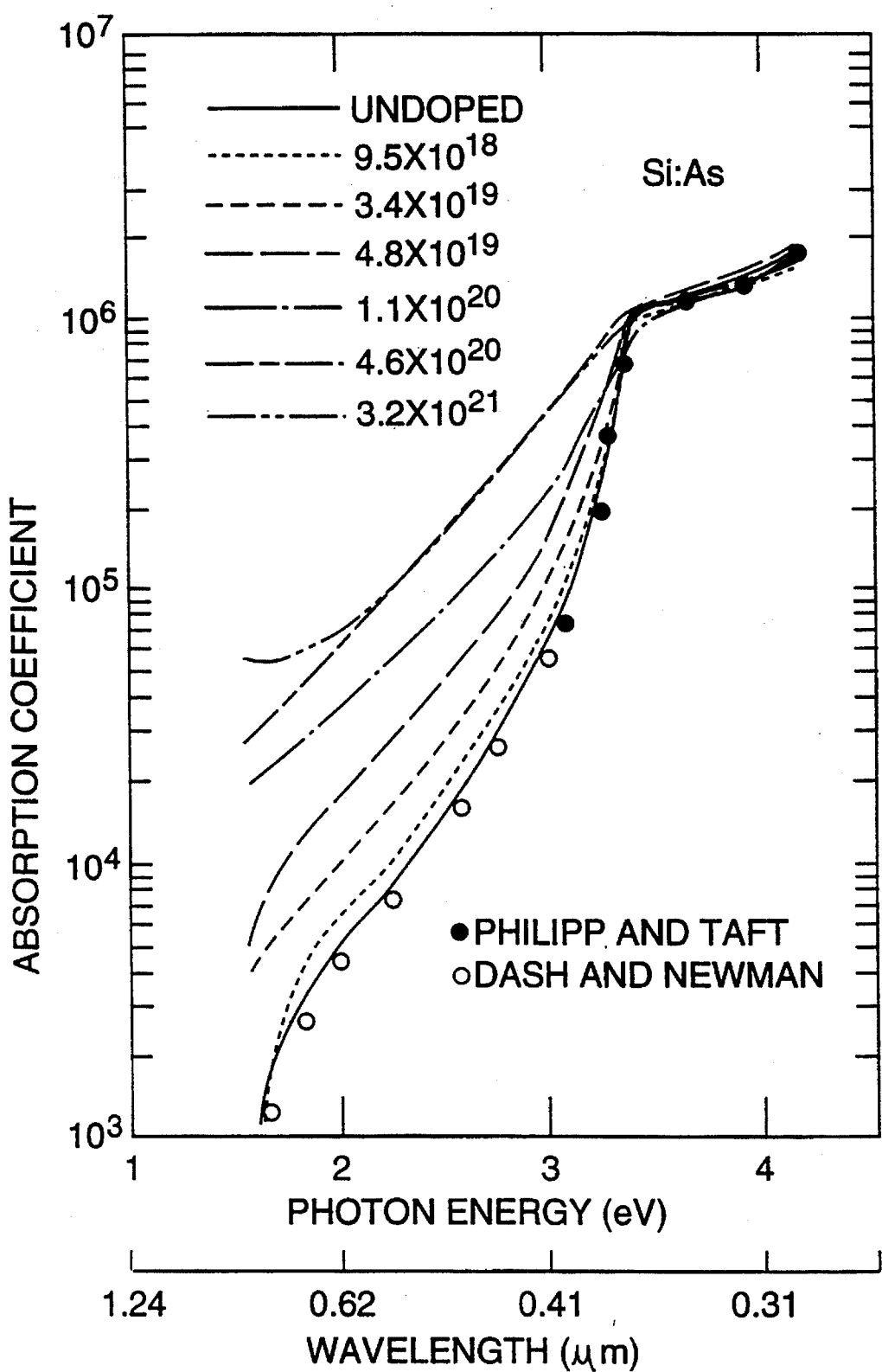
FIG. 3 shows graphical representations of the optical absorption coefficient versus laser photon energy (wavelength) for several arsenide concentrations in silicon.

FIG. 3 graphically shows the optical absorption coefficient versus laser photon energy (wavelength) for several arsenide concentrations in silicon. FIG. 3 is a replication of a figure from Jellison et al., *Phys. Rev. Let.,* Vol. 46, 1981, at 1414. FIG. 3 reveals that undoped silicon exhibits a sharp drop of absorption coefficient at wavelengths longer than about 1 μm. As the arsenide doping (and conductivity) of silicon increases, the drop of absorption coefficient at wavelengths longer than 1 μm is dramatically reduced. Detailed physics of this behavior are described in "Pulsed Laser Processing of Semiconductors," *Semiconductors and Semimetals,* Vol. 23 (Academic Press, Inc., 1984).

Although a reliable publication of the optical absorption versus wavelength from 1 to 2 μm for doped polysilicon, polycide, and disilicide is not readily available, skilled persons might expect that the absorption coefficients for these doped materials would drop more gently from 1 to 2 μm than the absorption coefficient for undoped silicon because the doped materials have a higher conductivity and/or different material nature than undoped silicon.

Figure 4:
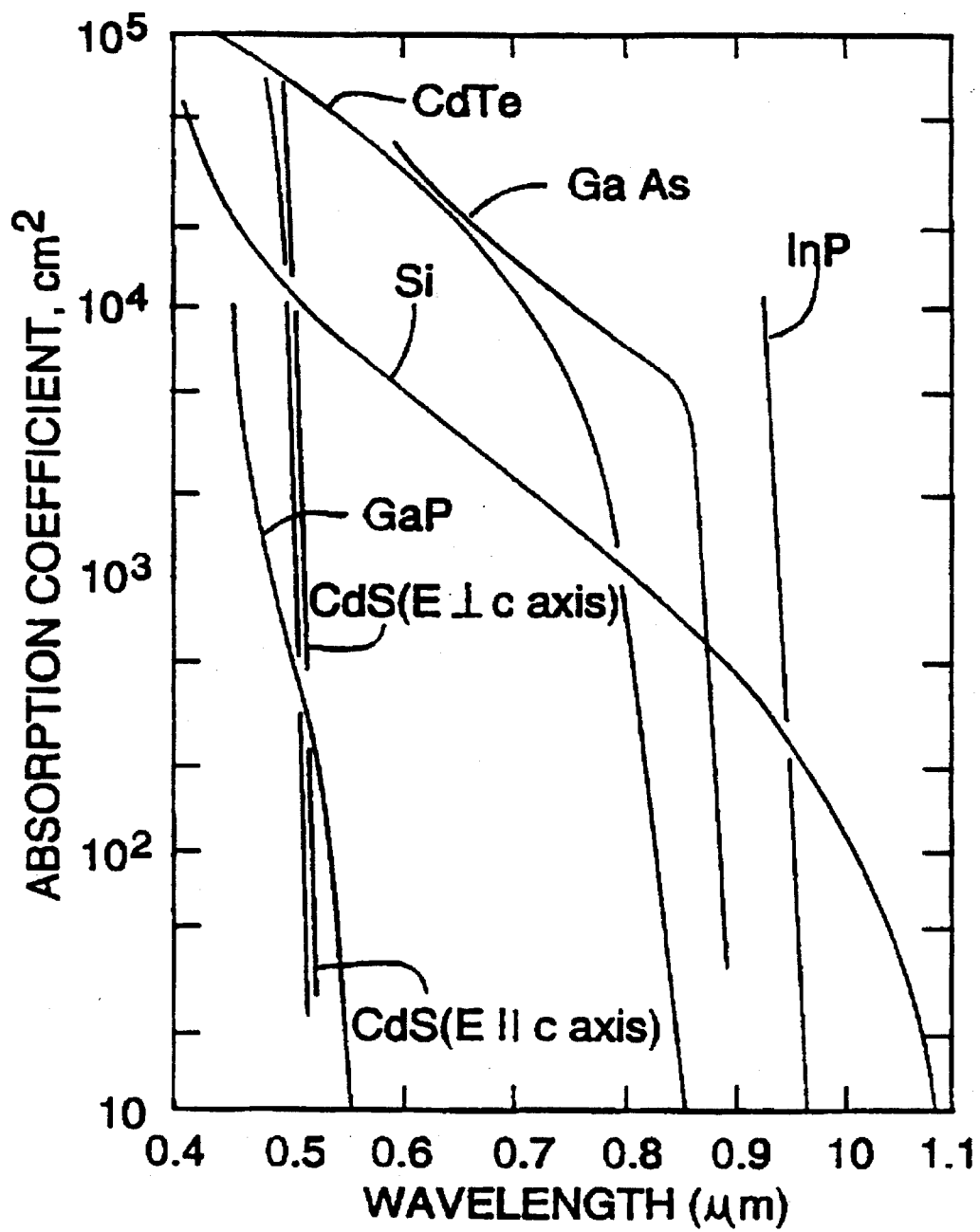
FIG. 4 shows graphical representations of the optical absorption properties versus wavelength for various semiconductors, including gallium arsenide, at room temperature.

FIG. 4 graphically shows the optical absorption coefficient versus wavelength for various semiconductors, including gallium arsenide, and silicon at room temperature. FIG. 4 is a replication of FIG. 156 from *"Handbook of Optics,"* Walter G. Driscoll ed., Optical Society of America (McGraw-Hill Book Co., 1978). The graph reveals that at room temperature, the optical absorption of silicon drops dramatically at wavelengths longer than 1.1 μm. Similarly, the optical absorption of gallium arsenide drops at wavelengths longer than about 0.9 μm (and is significantly less at wavelengths longer than 0.9 μm).

Figure 5:
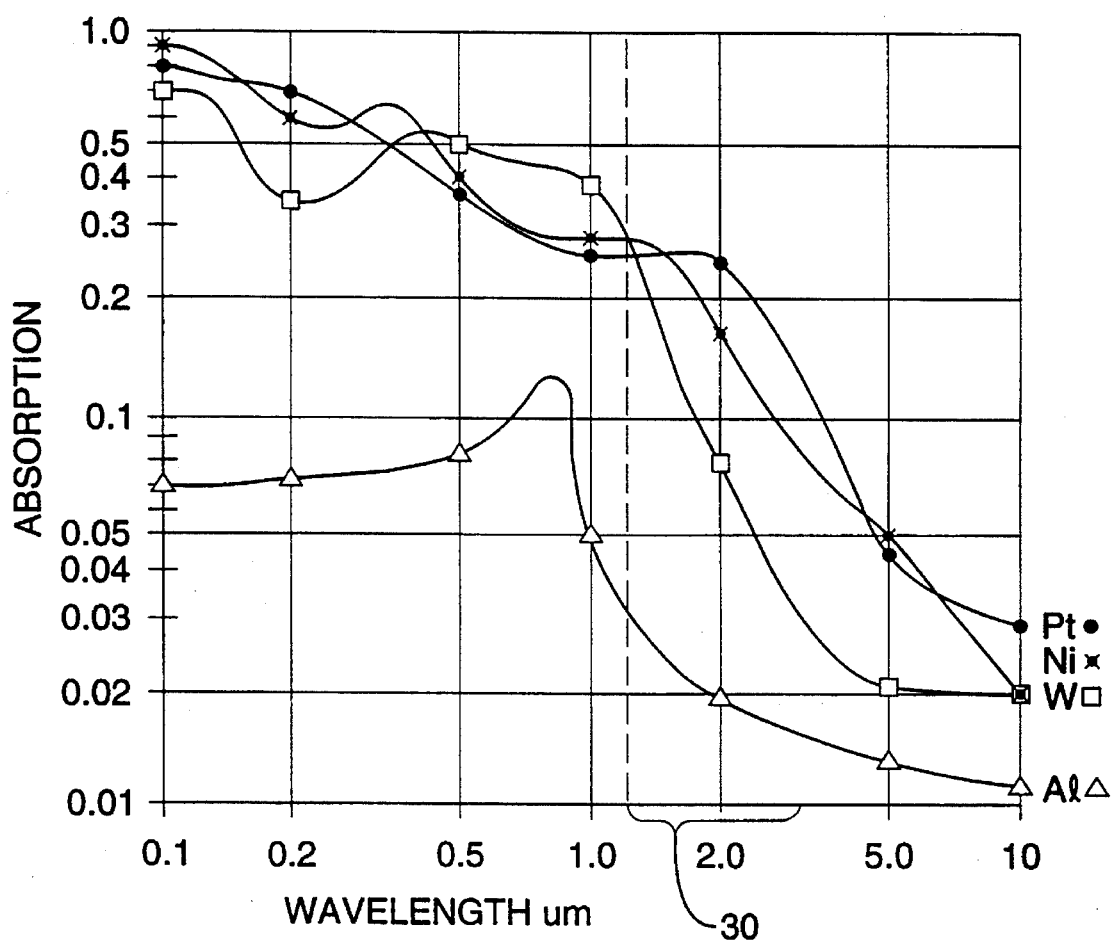
FIG. 5 shows graphical representations of the optical absorption properties of four different metals versus wavelength.
Figure 6:
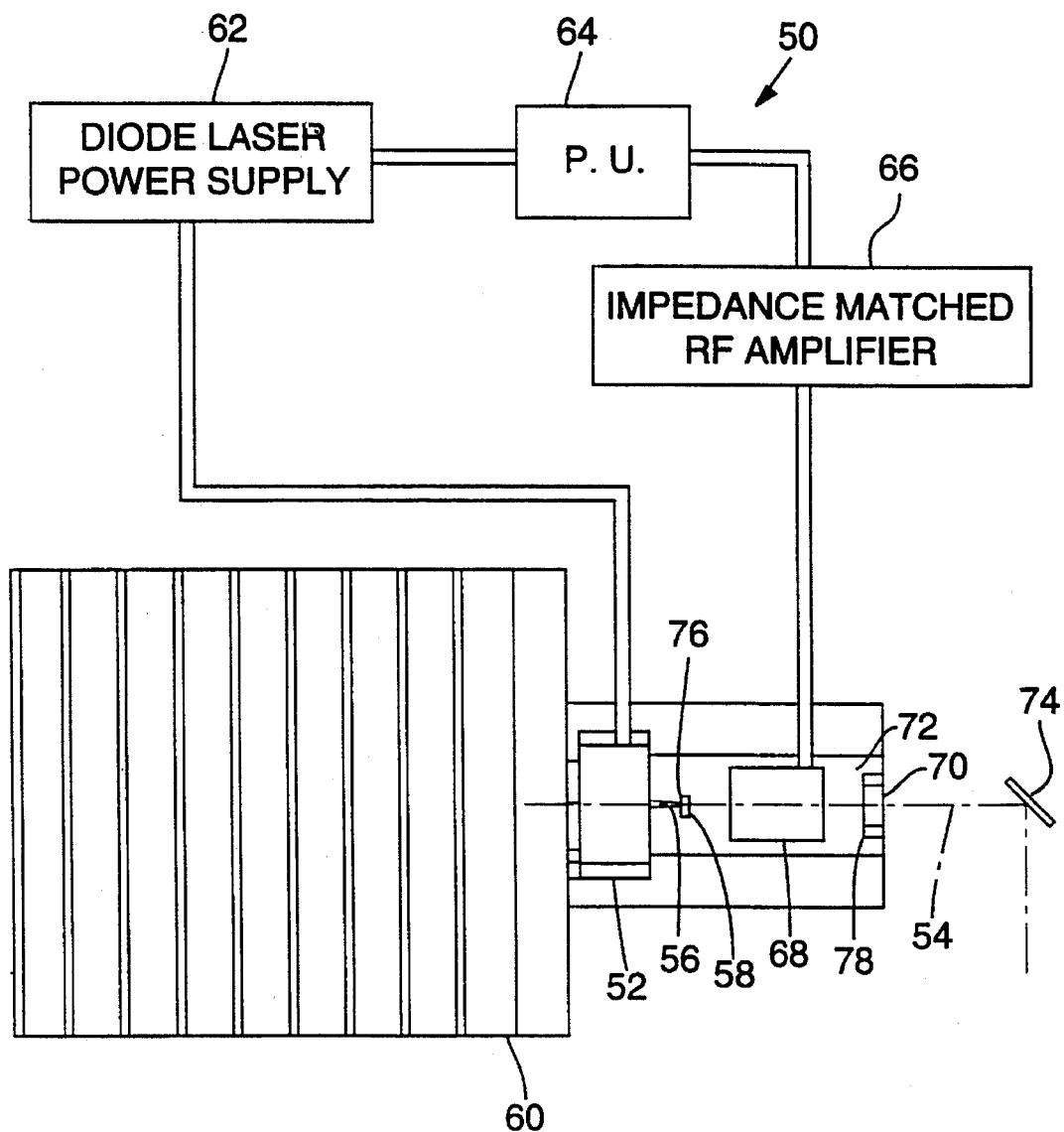
FIG. 6 is a plan view of a preferred embodiment of a laser system incorporating the present invention.

FIG. 5 graphically shows the optical absorptance properties of different metals such as aluminum, nickel, tungsten, and platinum that may be used as link structures 12. FIG. 5 is a compilation of the relevant portions of absorptance graphs found in "Handbook of Laser Science and Technology," *Volume IV Optical Materials: Part 2 By Marvin J. Weber* (CRC Press, 1986). FIG. 5 shows that metals, such as aluminum, nickel, tungsten, and platinum, absorb at laser wavelengths ranging from below 0.1 μm to about 3.0 μm, with aluminum absorptance lower than the other metals. Metal nitrides (e.g., titanium nitride) and other high-conductivity, metal-like materials used to form link structures 12 generally have similar optical absorption characteristics. However, the absorption coefficients for such materials are not as readily available as are those for metals.

The graphs in FIGS. 2 through 5 reveal a generally preferred overlap wavelength range 30 of about 1.2 to about 3 μm (and a most preferred wavelength range of about 1.2 to about 2 μm) in which silicon and other substrates 22 are almost transparent and in which the optical absorption behavior of a variety of link structure materials, especially metals, is sufficient for them to be processed. When comparing the 1.2 to 3 μm wavelength range 30 to conventional laser wavelengths of 1.064 μm, 1.047 μm, and 0.532 μm, skilled persons will note, for example, the optical transmittance of silicon increases by orders of magnitude while the optical absorption of metal link materials decreases by a factor of about two. Skilled persons will also be able to identify preferred wavelength ranges for other substrate materials, such as about 1 to 2.5 μm for gallium arsenide, based on the same considerations.

The contrast between the absorption, which is typically inversely proportional to transmittance, of substrate 22 and link structures 12 allows utilization of a higher peak power or energy laser pulse 10 to cut or process link structures 12 without a proportional increase in risk of damaging substrate 22 or adjacent circuit structures 20.

Because shorter wavelengths (within the 1.2 to 3 μm wavelength range 30) can be focused to smaller laser output spots 18 to maximize the energy coupled into small link structures 12, wavelengths such as 1.32 μm and 1.34 μm are sufficiently long to minimize damage to substrate 22 and are preferred for most link processing operations. The choice of 1.32 μm or 1.34 μm is also somewhat predicated on laser source availability and other complexities familiar to those skilled in the art.

Wavelengths of 1.5 to 3 μm may preferably be used to process link structures for some applications where the substrate doping level is higher or the link structure is physically too close to the substrate, imposing a higher probability of temperature elevation of the substrate due to laser energy absorption or thermal conduction from the heated link structures.

In a preferred embodiment, a conventional diode-pumped, solid-state laser with a lasant crystal such as Nd:YAG, Nd:YLF, ND:YAP, or Nd:YVO$_4$ is configured to produce output in the 1.2 to 3 μm wavelength range. Each such laser design employs resonator mirrors with appropriate dichroic coatings to be highly transmissive to the most conventional wavelength of the lasant crystal but have desired reflectivity at a selected wavelength within the range 1.2 to 3 μm and preferably at 1.32 μm or 1.34 μm. Such dichroic coatings would suppress laser action at the most conventional wavelength of the lasant crystal, such as 1.06 μm for Nd:YAG, and enhance laser action at the selected wavelength, preferably 1.32 μm for Nd:YAG.

In another preferred embodiment, a diode-pumped or arc lamp-pumped solid-state laser having a lasant crystal of YAG doped with other dopants such as holmium (laser output at 2.1 μm) or erbium (2.94 μm), or codoped with chromium, thalium, and holmium (2.1 μm), could be employed to deliver laser output within the 1.2 to 3 μm wavelength range.

In still another preferred embodiment, non-linear conversion schemes such as Raman shifting or optical parametric oscillation could be adapted to convert conventional laser wavelengths of about 1 μm into wavelengths in a range of 1.2 to 3 μm.

Preferably, all of the transmissive optics in a delivery path of the laser output beam are anti-reflection coated for the selected wavelength. In addition, laser output power or energy monitoring devices are changed to be responsive to the selected wavelength, for example, from Si for 1.064 μm to Ge or GaAlAs for 1.32 μm or 1.34 μm. Other minor optical modifications to compensate for changes in laser output focusing characteristics are preferred and known to those having skill in the art.

One skilled in the art will also recognize that pumping schemes, such as higher output power diode lasers or arc lamp-pumping, may be employed to compensate for the lower gain for lasant crystals such as Nd:YAG or Nd:YLF at 1.2 to 3 µm wavelengths. For example, with reference to an embodiment of a laser system 50 shown in FIG. 6, the output (preferably 3 watts or greater) of a high-power AlGaAs laser 52 may be funneled along optic axis 54 through a nonimaging concentrator 56 composed of a high-refractive index, crystalline dielectric material and then coupled into an Nd:YLF lasant crystal 58. This method is disclosed in U.S. Pat. No. 5,323,414 of Baird, DeFreez, and Sun for "Laser System and Method for Employing a Nonimaging Concentrator," which is assigned to the assignee of the present application.

Preferably, laser 52 is positioned against a heat sink 60 and is powered by a diode laser power supply 62 that is controlled by a processing unit 64. Processing unit 64 is also connected to an impedance-matched RF amplifier 66 and controls signals delivered to a transducer coupled to a Q-switch 68. Q-switch 68 is preferably positioned between lasant crystal 58 and an output coupler 70 within a resonator cavity 72. A targeting and focusing system 74 may be employed to direct laser output to a desired position on link structure 12 or other target material. Pumping, Q-switching, and targeting of laser system 50 of the preferred embodiment are accomplished through conventional techniques well-known to persons skilled in the art.

An input mirror coating 76 on lasant crystal 58 and an output mirror coating 78 on output coupler 70 are preferably highly transmissive at the conventional 1.047 µm YLF emission wavelength. In addition, input mirror coating 76 is transmissive to the AlGaAs emission wavelength range and reflective at about 1.32 µm, and coating 78 is only partly transmissive at 1.32 µm to permit laser operation.

Skilled persons will appreciate that the significant absorption contrast between link structures 12 and the surrounding substrate 22 will allow use of much higher processing powers than could be used with conventional 1.047 µm or 1.064 µm laser wavelengths without causing damage to substrate 22, i.e, the energy of laser output 10 in excess of that used to process link structures 12 will not be absorbed by the underlying substrate 22 during and after the link structures 12 structures have been processed. At the longer wavelengths, more laser energy can be delivered to link structures 12 to facilitate a more complete cutting of link structure 12.

Persons skilled in the art might expect that the level of hole-electron pairs created at the preferred high-intensity light level would induce metal-like characteristics in substrate 22, thereby adversely affecting the desired low absorption by substrate 22. Experiments have shown, however, that at processing laser power levels, the absorptance of lightly doped substrates remains low at 1.32 µm.

Higher laser output power may raise the temperature of the link structure material more quickly and exceed the required latent heat of vaporization of the link material, therefore resulting in direct vaporization of most or all of the link structure material. This direct vaporization is preferred because it will reduce the chance of redeposition of the "removed" link structure material back onto the surrounding area of the substrate. On the other hand, if the laser power is curtailed in an attempt to prevent substrate damage (as in link processing laser systems with conventional wavelength lasers), then the direct vaporization rate of the link structure material would be much lower. Such insufficient laser power may cause link structure material in the liquid state to be splashed away and redeposited on the surrounding area of substrate 22 as a conductive "slag," that may cause malfunction of the integrated circuit device.

It will be obvious to those having skill in the art that many changes may be made to the details of the above-described embodiments of this invention without departing from the underlying principles thereof. Accordingly, it will be appreciated that this invention is also applicable to laser-based operations for different semiconductor substrate materials, as well as laser-based operations outside the semiconductor industry, for selective removal of one or more materials from a multimaterial device. The scope of the present invention should, therefore, be determined only by the following claims.

I claim:

1. A method for selectively processing a multilayer, multimaterial device that includes a substrate and a nonmetal target structure having respective first and second wavelength-sensitive light absorption characteristics, the first and second absorption characteristics having different light absorption properties that provide different light absorption contrasts for different wavelengths of light, comprising:

generating at a predetermined wavelength a laser output having a predetermined spatial spot size; and directing the laser output to illuminate the nonmetal target structure, the predetermined wavelength providing a sufficiently large absorption contrast between the nonmetal target structure and the substrate to change a physical property of the nonmetal target structure but leave substantially unchanged the physical property of the substrate within the spatial spot size of the laser output.

2. The method of claim 1 in which the substrate comprises silicon, gallium arsenide, or other semiconductor materials.

3. The method of claim 2 in which the nonmetal target structure comprises doped polysilicon, polycide, or disilicide material.

4. The method of claim 1 in which the wavelength of the laser output is in about the 1.2 to 3 µm range.

5. The method of claim 1 in which the nonmetal target structure has a width that is smaller than the spatial spot size of the laser output.

6. The method of claim 1 in which the nonmetal target structure comprises multiple layers and the laser output comprises energy in excess of that which is required to process the nonmetal structure.

7. The method of claim 1 in which the laser output is generated by a Q-switched, solid-state laser.

8. The method of claim 1 in which the nonmetal target structure comprises doped polysilicon, polycide, or disilicide material.

9. A laser system for selectively processing a nonmetal target structure of a multilayer, multimaterial device including a substrate, the nonmetal target structure and substrate having wavelength-sensitive properties, comprising:

a pumping source; and a lasant positioned in a resonator cavity adapted to be pumped by the pumping source to provide a laser output having a spatial spot size, power, and wavelength selected to exploit differences in the wavelength-sensitive properties of the nonmetal target structure and the substrate such that the nonmetal target structure within the spatial spot size is effectively processed and the substrate within the spatial spot size is relatively undamaged by the laser output.

10. The laser system of claim 9 in which the substrate comprises silicon, gallium arsenide, or other semiconductor materials.

11. The laser system of claim 9 in which the wavelength of the laser output is in about the 1.2 to 3 μm range.

12. The laser system of claim 9 in which the nonmetal target structure has a width that is smaller than the critical dimensions of the laser output.

13. The laser system of claim 9 in which the nonmetal target structure comprises multiple layers and the laser output comprises energy in excess of that which is required to process the nonmetal target structure.

14. The laser system of claim 9 further comprising a Q-switched, diode-pumped or arc-lamp pumped, solid-state laser.

15. The laser system of claim 9 in which the lasant is selected from the group of Nd:YAG, Nd:YLF, Nd:YAP, and Nd:YVO$_4$ and in which the resonator cavity employs resonator mirrors that are highly transmissive to a conventional wavelength of the lasant but have desired reflectivity within a wavelength range of 1.2 to 3 μm.

16. The laser system of claim 9 in which the lasant comprises YAG doped with holmium or erbium, or codoped with chromium, thulium, and holmium, and the resonator cavity is adapted to generate laser output within a wavelength range of 1.2 to 3 μm.

17. The laser system of claim 9 in which non-linear frequency conversion is adapted to generate laser output within a wavelength range of 1.2 to 3 μm.

18. The laser system of claim 9 in which the nonmetal target structure comprises doped polysilison, polycide, or disilicide material.

19. A method for employing a laser system to process nonmetal link structures formed on a silicon, gallium arsenide, or other semiconductor substrate, comprising:

generating laser output in a wavelength range of about 1.2 to 3 μm; and directing the laser output at the nonmetal link structure such that it is effectively processed but the substrate is relatively undamaged.

20. The method of claim 19 in which the nonmetal link structure comprises multiple layers and the laser output comprises energy in excess of that which is required to process the nonmetal link structure.

21. The laser system of claim 19 in which the nonmetal link structure comprises doped polysilison, polycide, or disilicide material.

* * * * *

UNITED STATES PATENT AND TRADEMARK OFFICE
CERTIFICATE OF CORRECTION

PATENT NO. : 5,473,624
DATED      : December 5, 1995
INVENTOR(S): Yunlong Sun

It is certified that error appears in the above-indentified patent and that said Letters Patent is hereby corrected as shown below:

Claim 21, line 1, column 10, line 22, change "laser system" to --method--.

Signed and Sealed this

First Day of April, 1997

BRUCE LEHMAN

*Attest:*

*Attesting Officer*    Commissioner of Patents and Trademarks